United States Patent [19]

Tseng et al.

[11] Patent Number: 5,464,792

[45] Date of Patent: Nov. 7, 1995

[54] PROCESS TO INCORPORATE NITROGEN AT AN INTERFACE OF A DIELECTRIC LAYER IN A SEMICONDUCTOR DEVICE

[75] Inventors: Hsing-Huang Tseng; Philip J. Tobin, both of Austin, Tex.

[73] Assignee: Motorola, Inc., Schaumburg, Ill.

[21] Appl. No.: 186,957

[22] Filed: Jan. 27, 1994

Related U.S. Application Data

[63] Continuation-in-part of Ser. No. 71,885, Jun. 7, 1993, Pat. No. 5,407,870.

[51] Int. Cl.$^6$ .................................................. H01L 21/225
[52] U.S. Cl. ........................ 437/160; 437/241; 437/242
[58] Field of Search .................................. 437/160, 164, 437/241, 242

[56] References Cited

U.S. PATENT DOCUMENTS 5,063,423  11/1991  Fuji et al. ............................ 357/23.5

FOREIGN PATENT DOCUMENTS 0114632  4/1990  Japan .................................. 437/164

OTHER PUBLICATIONS

Yoshio Okada et al., "Relationship between growth conditions, nitrogen profile, and charge to breakdown of gate oxynitrides grown from pure N2O", American Institute of Physics/1993, Applied Physics Letter 63, 12 Jul. 1993, pp. 194–196.
G. W. Yoon et al., "MOS Characteristics of NH3-Nitrided N2O-Grown Oxides", IEEE Electron Device Letters, (14), No. 4, Apr. 1993, pp. 179–181.
S. Ohnishi et al., "Ultrathin Oxide/Nitride/Oxide/Nitride Multilayer Films for Mbit DRAM Capacitors", Solid State Devices & Materials, Ext. Abstracts of '92 Int. Conf. Aug., pp. 67–69.
S. Haddad et al., "Improvements of Thin–Gate Oxide Integrity Using Through–Silicon–Gate Nitrogen Ion Implantation", IEEE Electron Device Letters, vol. EDL-8 No. 2, Feb. 1987, pp. 58–60.
J. Ahn et al., "Furnace Nitridation of Thermal SiO2 in Pure N2O Ambient for ULSI MOS Applications", IEEE Electron Device Letters, vol. 13, No. 2, Feb. 1992, pp. 117–119.
G. Q. Lo et al., "Improved Hot–Carrier Immunity in CMOS Analog Device With N2O–Nitrided Gate Oxides" IEEE Electron Device Letters, vol. 13, No. 9, Sep. 1992, pp. 457–459.
H. Fukuda et al., "High–Performance Scaled Flash–Type EEPROMs With Heavily Oxynitrided Tunnel Oxide Films", IEEE IEDM 1992, pp. 465–468.
P. Molle et al., "Sealed Interface Local Oxidation by Rapid Thermal Nitridation" J. Electrochem. Soc., vol. 138, No. 12, Dec. 1991, The Electrochemical Society, pp. 3732–3738.
G. Q. Lo et al., "Improved Performance and Reliability of MOSFETs With Ultrathin Gate Oxides . . . " VLSI Symposium 1991, pp. 43–44.
Research Disclosure Document #18756, "Under–grown multiple dielectric–layer semiconductor device", Derwent Publications, Nov. 1979, pp. 652–653.

*Primary Examiner*—R. Bruce Breneman
*Attorney, Agent, or Firm*—Patricia S. Goddard

[57]  ABSTRACT

Nitrogen is piled-up at a top interface of a gate dielectric layer by a process of the present invention. A gate dielectric layer (14) is formed on a substrate (12). A buffer layer (16), such as polysilicon, is formed on the dielectric layer. A nitrogen source layer (18), such as oxynitride, is formed on the buffer layer. The device is annealed to drive nitrogen from the source layer through the buffer layer and to an interface (15) between the polysilicon and the dielectric, resulting in a high nitrogen concentration at this interface. A nitrogen concentration may also be achieved at an interface (13) between the dielectric layer and the substrate.

19 Claims, 3 Drawing Sheets

PROCESS TO INCORPORATE NITROGEN AT AN INTERFACE OF A DIELECTRIC LAYER IN A SEMICONDUCTOR DEVICE

CROSS-REFERENCE AND CLAIM TO PRIORITY OF A RELATED APPLICATION

The present application is related to, and is being filed as a continuation-in-part of, a commonly assigned, patent application entitled, "Process for Fabricating a Semiconductor Device Having a High Reliability Dielectric Material," by Yoshio Okada et al., Ser. No. 08/071,885, filed Jun. 7, 1993 now U.S. Pat. No. 5,407,870.

1. Field of the Invention

The present invention relates to processes for making a semiconductor device in general, and more specifically to processes for incorporating nitrogen at an interface of a dielectric layer within a semiconductor device.

2. Background of the Invention

In the fabrication of a metal-oxide-semiconductor (MOS) device, the gate integrity of the dielectric material is a key factor in determining the long term reliability characteristics of the device. In an MOS transistor, the gate dielectric material must support a substantial voltage difference between the gate electrode and the semiconductor substrate. The gate dielectric material must also maintain its ability to support the voltage difference between the gate and the substrate, while being subjected to the electron and hole injection from both the gate electrode and the substrate. In the case of very-large-scale-integration (VLSI) devices, the effective gate lengths are on the order of less than 1 micron. At such small effective gate lengths, electrons can be injected into the dielectric layer during periods when the transistor in switched on and off. The injection of electrons into the dielectric material can, over time, cause a shift in the threshold voltage of the transistor. Over an extended period of time, a continual shift in the threshold voltage eventually results in an inability to switch the transistor on and off. Therefore, it is important in the fabrication of an MOS transistor that a high quality dielectric material be provided in order to insure long term reliability of the transistor.

In the search for more robust dielectric materials, researchers have turned to oxynitride materials. Oxynitrides have demonstrated excellent endurance to electron and hole injection over prolonged periods of time. The endurance of oxynitride is thought to be related to the accumulation of nitrogen near the silicon-silicon dioxide (Si/SiO$_2$) interface.

Several techniques have been developed for the formation of an oxynitride dielectric material. In one method, silicon dioxide for use as a gate dielectric is formed by thermal oxidation of a silicon substrate. Polysilicon is then deposited and implanted with a high dose of nitrogen. An anneal step is used to drive the nitrogen from the polysilicon layer to produce increased concentrations of nitrogen at the silicon dioxide interfaces. (See, e.g., "Improvement of Thin-Gate Oxide Integrity Using Through-silicon-Gate Nitrogen Ion Implantation," S. Haddad et al., IEEE, Electron Dev. Letters, (EDL-8), 2, 1987, pp. 58–60). In another method, ammonia is used to increase the nitrogen concentration at an oxide interface grown using N$_2$0. (See, e.g., "MOS Characteristics of NH$_3$-Nitrided N$_2$0-Grown Oxides," G. W. Yoon et al., IEEE, Electron Dev. Letters (14), 4, 1993, pp. 179–181). In yet another method, oxynitride is formed by subjecting a silicon substrate to rapid thermal annealing in a nitrous oxide ambient. (See, e.g., "High-Performance Scaled Flash-Type EEPROMs with Heavily Oxynitrided Tunnel Oxide Films," H. Fukuda, et al., IEEE, IEDM 1992, pp. 465–466). While the foregoing techniques are effective for the formation of an oxynitride material, to obtain the enhanced dielectric endurance required by VLSI MOS devices, such as MOS transistors and floating-gate electron tunneling MOS (FETMOS) electrically erasable and programmable read-only memory (EEPROM) devices, and the like, further development is necessary to enhance the charge-to-breakdown value of a dielectric material.

SUMMARY OF THE INVENTION

With the present invention, a semiconductor device is fabricated by first providing a substrate. A first dielectric layer is formed on the substrate, and a buffer layer is deposited on the first dielectric layer. The buffer layer is exposed to a nitrogen source and nitrogen is diffused through the buffer layer and into the first dielectric layer to create a region of high nitrogen concentration near an interface between the buffer layer and the first dielectric layer.

These and other features, and advantages, will be more clearly understood from the following detailed description taken in conjunction with the accompanying drawings. It will be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate like or corresponding elements. It is also important to point out that there may be other embodiments of the present invention which are not specifically illustrated.

DETAILED DESCRIPTION OF A PREFERRED EMBODIMENT

A process in accordance with the present invention provides a dielectric material having a precisely tailored nitrogen concentration profile therein. The process further provides high nitrogen concentrations in regions of the dielectric material which are adjacent to electrically conductive or semiconductive bodies. Whereas prior art devices have found improvements in establishing a high nitrogen concentration at or near an interface between a silicon substrate and an SiO$_2$ layer interface, the present invention provides further improvement by likewise establishing a high nitrogen concentration at an interface between the SiO$_2$ layer and an overlying conductive layer, for example a first level polysilicon layer. By providing a dielectric material having areas of high nitrogen concentration at both top and bottom interfaces of a dielectric layer, the charge-to-breakdown ($Q_{bd}$) value is improved over dielectric materials of the prior art. A high $Q_{bd}$ value increases the reliability of the dielectric material over extended periods of time.

Figure 1:
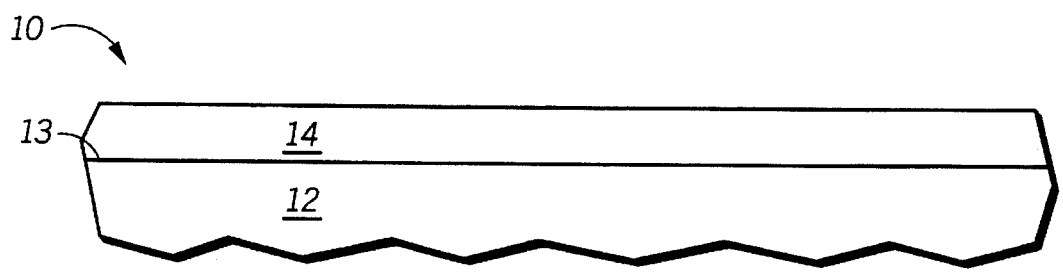
FIGS. 1–4 illustrate, in cross-section, process steps in accordance with an embodiment of the present invention to incorporate nitrogen into a dielectric layer of a semiconductor device.
Figure 2:
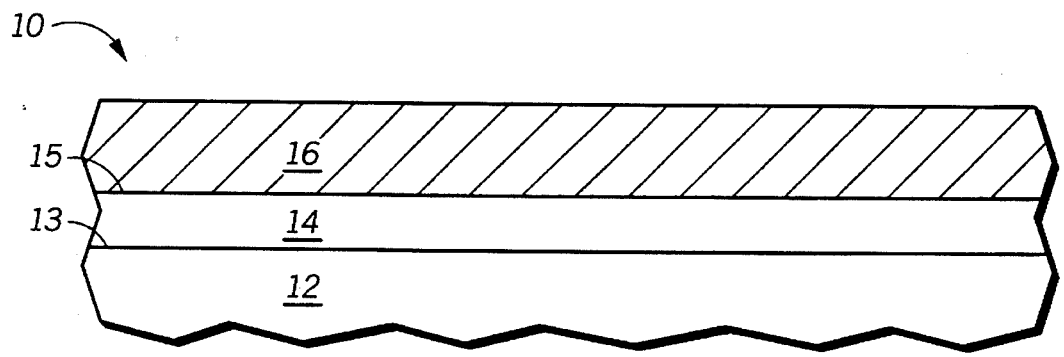
Figure 3:
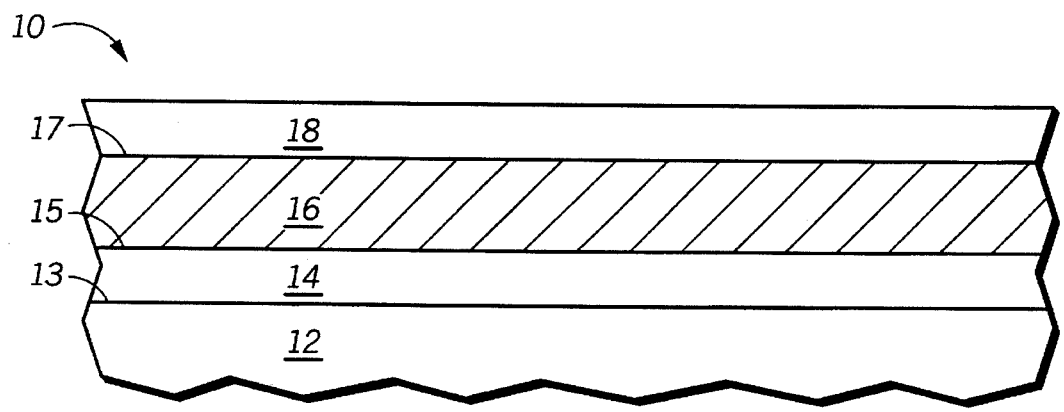

Shown in FIG. 1, is a portion of a semiconductor device 10. Device 10 includes a substrate 12, which in a preferred embodiment is a silicon substrate. Formed on substrate 12 is a first dielectric layer 14. First dielectric layer 14 is likely to be a gate dielectric layer within device 10, and is therefore made of a material common for this purpose, such as $SiO_2$, oxynitride, or the like. As an $SiO_2$ layer, layer 14 is thermally grown or deposited to an appropriate thickness using a standard process. Chemical vapor deposited (CVD) $SiO_2$ may also be used. Similarly, to form layer 14 as an oxynitride layer, one of several known thermal or CVD processes may be used, including processes described in the articles cited in the background portion of the present application. Also, oxynitride may be formed by heating substrate 12, with or without pre-grown oxide, to a temperature of about 900°–11500° C., and introducing nitrous oxide ($N_2O$)) into the furnace or rapid thermal processor. In a conventional furnace the time to form an oxynitride layer is typically between 5–45 minutes, whereas in a rapid thermal processor the time is between 10–200 seconds. Nitric oxide (NO) may be used to form an oxynitride layer in place of $N_2O$ in either a conventional furnace or rapid thermal processor, within temperature ranges of about 700°–1000° C. and for similar time periods as those already listed. Rather than being a single layer, dielectric layer 14 may instead be a stacked gate dielectric, such as a CVD/thermal stacked gate oxide or an oxynitride stacked gate oxide.

As herein used, the term "oxynitride" is intended to mean an oxygen-based ($SiO_2$) dielectric layer wherein nitrogen is piled-up or accumulated at an interface between the dielectric and an adjacent layer, as opposed to a dielectric layer in which the nitrogen concentration is the same throughout the dielectric thickness. For example, in FIG. 1, if layer 14 is an oxynitride layer, a nitrogen pile-up is present at or near an interface 13 between the dielectric layer and the substrate. Oxynitride, also referred to in the industry as nitrided oxide, is believed to have higher nitrogen concentrations at interfaces because of a thermodynamically favored reaction between nitrogen species and dangling bonds at the dielectric substrate interface, particularly dangling silicon bonds.

After forming first dielectric layer 14, a buffer layer 16 is deposited onto layer 14. Buffer layer 16 is called a buffer layer because it will serve as a buffer between a subsequently deposited layer or region of high nitrogen concentration and first dielectric layer 14. In a preferred embodiment, buffer layer is a polysilicon or amorphous silicon layer which is deposited to between about 100–5000 angstroms thick, for example 500 angstroms thick. If buffer layer 14 is deposited as amorphous silicon, it may recrystallize during subsequent device fabrication steps. Other thicknesses may be suitable, provided a sufficient amount of nitrogen is able to diffuse through buffer layer 16, as discussed below. Similarly, materials other than polysilicon may serve as a buffer layer, for example titanium silicide and tungsten silicide. In general, any material through which a low level of nitrogen diffusion can occur is suitable for use as a buffer layer, where low level nitrogen diffusion refers to diffusion levels low enough to provide nitrogen accumulation at dielectric interfaces without accumulation through the bulk of the dielectric.

Next, a nitrogen source layer 18 is formed on buffer layer 16. In a preferred form, source layer 18 is an oxynitride layer grown on a polysilicon buffer layer. To form an oxynitride source layer, device 10 is heated to a temperature of about 900° to 1000° C. in a conventional furnace, or to between 900°–1150° C. in a rapid thermal processor. $N_2O$ is introduced into the reactor. In the reactor, a chemical reaction is carried out for between 5–60 minutes in a conventional furnace or for between 10–200 seconds using a rapid thermal processor to form a source layer 18 having a thickness of about 50–500 angstroms. Other processes known to form oxynitride may also be used to form source layer 18, for example using NO in place of $N_2O$ as described earlier. The growth process is preferably tailored so that there is a high nitrogen concentration at or near an interface 17 between the source layer 18 and buffer layer 16. As discussed above, many conventional oxynitride processes produce such nitrogen profiles. A nitrogen pile-up desired at interface 17 occurs similarly to the way nitrogen is piled-up at an $SiO_2$—Si interface.

After forming source layer 18, nitrogen from the source layer is driven through buffer layer 16 and accumulates in dielectric layer 14 near an interface 15 between the dielectric layer and buffer layer 16. This is accomplished by an anneal step using either a conventional furnace or rapid thermal processing. Using an oxynitride source layer and polysilicon buffer layer having a thickness of 500 angstroms, a rapid thermal anneal at 1100° C. for 150 seconds in a pure nitrogen environment was sufficient to accumulate nitrogen at the polysilicon-dielectric interface. Generally, rapid thermal processing conditions should be between 900°–1150° C. for 10–300 seconds and preferably between 20–200 seconds, while conventional furnace processing should be between 900°–1000° C. for 5–60 minutes. Although not wanting to be bound by a particular theory of the invention, the inventors believe the nitrogen accumulates at or near interface 15 due to the availability of dangling silicon bonds at the interface. Nitrogen diffuses through the dielectric layer (whether it is an oxide or oxynitride) and accumulates at the dielectric-silicon interface. Too much nitrogen will saturate available sites near the interface and then accumulate in the bulk of the dielectric. Accumulation of nitrogen within the bulk of dielectric layer 14 is undersirable because of an associated increase in electron traps. During this anneal, nitrogen may also pile-up at or near interface 13 between dielectric layer 14 and substrate 12. If dielectric layer 14 is deposited as an oxynitride, a nitrogen pile-up may already exist near interface 13, prior to diffusing nitrogen through buffer layer 16. However, during the anneal step to diffuse nitrogen, additional nitrogen may also pile-up near interface 13 if bonding sites are available. Because nitrogen will bond at the lowest possible energy sites available, it is likely that nitrogen accumulation will occur at or near interfaces 13 and 15 prior to accumulation within the bulk of dielectric layer 14.

Figure 4:
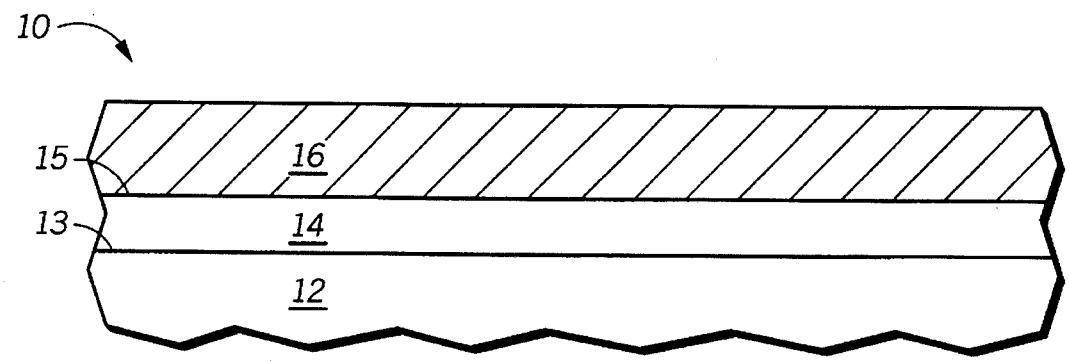

Once nitrogen has been diffused through to the top interface 15 of dielectric layer 14, the nitrogen source layer 18 may be removed as illustrated in FIG. 4. For example, if source layer 18 is oxynitride and buffer layer 16 is polysilicon, source layer 18 may be removed by using an etch of 100 parts water to 1 part HF for about 300 seconds. Buffer layer 16 may be removed if it is not the desired material to remain above dielectric layer 14. However, if buffer layer 16 is polysilicon, it is likely that it may remain on device 10 and be used as a gate electrode. If buffer layer 16 is deposited to a thickness which is suitable for use as a gate electrode, the buffer layer is simply patterned to form the gate electrode. If, however, the buffer layer is thinner than the desired gate electrode thickness, an additional layer may be deposited on the buffer layer after removing source layer 18 to achieve the desired thickness. The buffer layer and the additionally deposited layer are then patterned to form the gate electrode.

Figure 5:
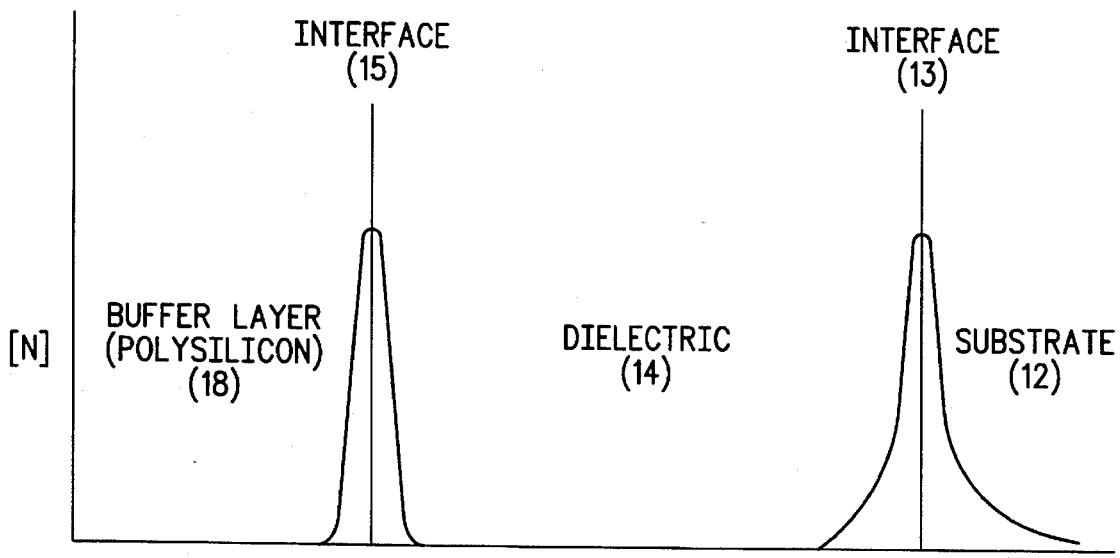
FIG. 5 graphically illustrates nitrogen distribution within the dielectric layer of the device as fabricated in FIGS. 1–4.

FIG. 5 graphically illustrates the nitrogen concentration within device 10 after performing the process described above. A first nitrogen pile-up occurs at or near interface 15, the interface between the polysilicon buffer layer and dielectric layer 14. A second nitrogen pile-up occurs at or near interface 13 between substrate 12 and dielectric layer 14. The extent of the second nitrogen pile up is likely to be affected by the material used for dielectric layer 14, as explained above. A higher nitrogen concentration is expected if dielectric layer 14 is formed as oxynitride, as compared to forming dielectric layer 14 as pure $SiO_2$. In general, having a high nitrogen concentration near interface 13 is desirable to improve the integrity and durability of dielectric layer 14. However, benefits of the present invention may be achieved with only a nitrogen pile-up at the top interface 15 of dielectric layer 14.

As a result of practicing the present invention, dielectric layer 14 is precisely constructed to contain a region of nitrogen accumulation at the top interface 15 of dielectric layer 14, and if desired also at the bottom interface 13. An important aspect of the present invention includes the ability of dielectric layer 14 to maintain high $Q_{bd}$ values over an extended period of time. The regions of nitrogen accumulation in dielectric layer 14 passivates interface states near the interfaces of dielectric layer 14. As will subsequently be described, the durability of dielectric layer 14 makes dielectric layer 14 especially useful as a tunnel gate dielectric material for an EEPROM device.

Figure 6:
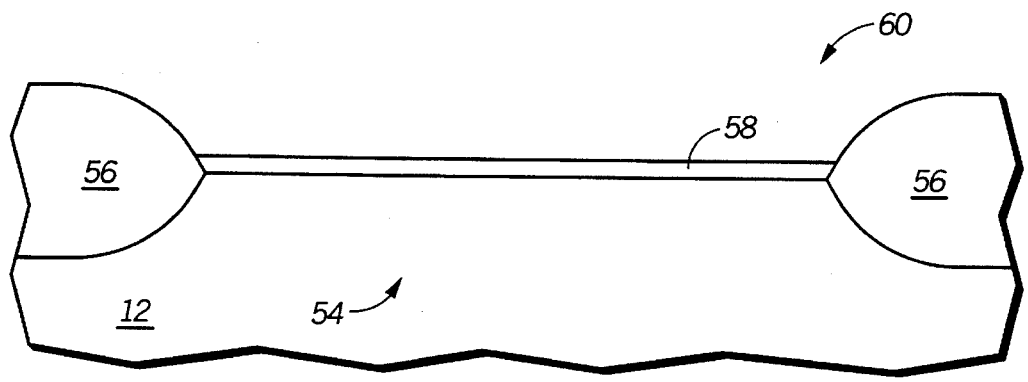
FIGS. 6–8 illustrate, in cross-section, process steps in accordance with another embodiment of the present invention for fabrication of an EEPROM semiconductor device.
Figure 7:
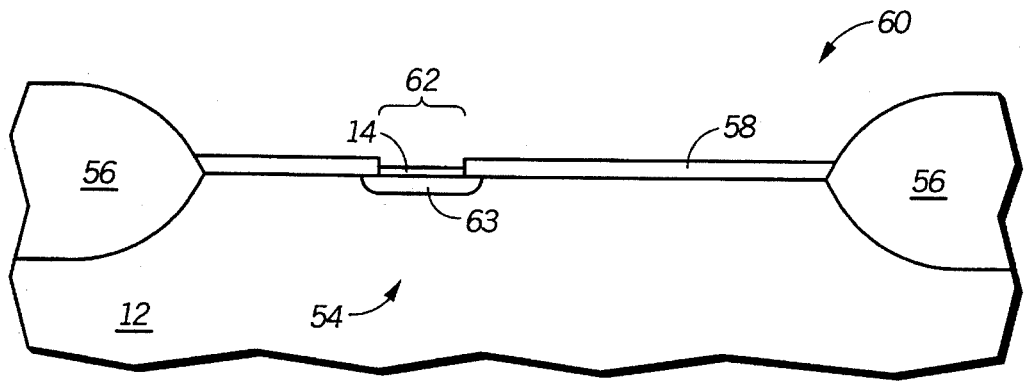
Figure 8:
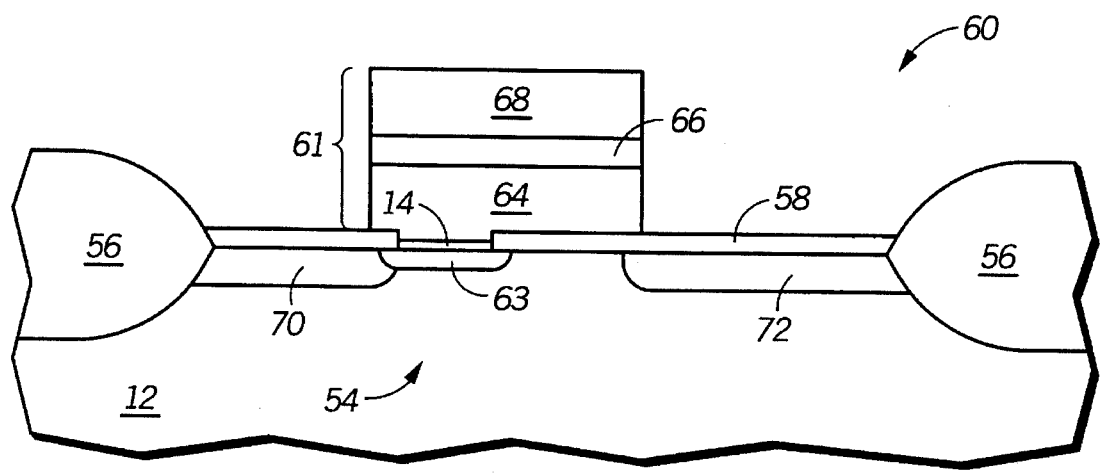

FIGS. 6-8 illustrate one application of the invention in the fabrication of an EEPROM device. Only those process steps necessary for explaining the invention are illustrated and described. The process, of course, may include other steps which are necessary for the fabrication of a complete device, but which do not involve the invention. To avoid confusion, many steps, which are conventionally used in semiconductor processing, have not been shown.

FIG. 6 illustrates, in cross-section, a portion of semiconductor device 60 having already undergone several process steps in accordance with the invention, as previously described. In substrate 12, an active region 54 is defined by a field oxide region 56, which is formed in the surface of substrate 12. A first gate dielectric layer 58 overlies the surface of active region 54. Dielectric layer 58 is preferably formed by thermal oxidation of substrate 12 using dry oxygen gas. The oxidation process is carried out at a temperature of about 925° to 975° C. and preferably at 950° C. During the oxidation process, the temperature is ramped-up to about 1050° C. and an intermediate argon annealing step is performed. Alternatively, gate dielectric layer 58 can be a dielectric material other than $SiO_2$, such as chemical vapor deposited silicon nitride, silicon oxynitride, and the like.

Following the formation of gate dielectric layer 58, a lithographic pattern is formed on substrate 12, and ion implantation step is carried out to form a tunnel region 63 in substrate 12, as illustrated in FIG. 7. After forming tunnel region 63, an etching process is performed to etch an opening 62 in a portion of gate dielectric layer 158 overlying tunnel region 63. In one method, the same lithographic pattern used to define tunnel region 63 can also be used to provide an etch mask for the formation of opening 62. Once opening 62 is defined in gate dielectric layer 58, dielectric layer 14 is formed on the portion of substrate 12 which is exposed by opening 62. The same processing steps as those illustrated in FIGS. 1-4 and previously described are employed to form dielectric layer 14 in opening 60. Dielectric layer 14 forms a second gate dielectric within device 60 which is referred to as a tunnel dielectric.

The process is continued, as illustrated in FIG. 8, by forming a stacked-gate electrode 61 overlying dielectric layer 14, and a portion of first gate dielectric layer 58. Stacked-gate electrode 61 includes a floating gate electrode 64, an inter-gate dielectric layer 66, and a control gate 68. In one method, stacked-gate electrode 61 is formed by sequentially depositing a first polysilicon layer, a dielectric layer, and a second polysilicon layer. A lithographic mask is defined on the second polysilicon layer and the polysilicon layers, and the intermediate gate dielectric layer are sequentially etched. Preferably, an anisotropic etching process is used to form stacked-gate electrode 61. Since floating gate electrode 64 is formed of polysilicon, this layer may serve as the buffer layer 16 used to form dielectric layer 14 in accordance with the present invention.

Those skilled in the art will recognize stacked-gate electrode 61 as a common element of an EEPROM device. Preferably, inter-gate dielectric layer 66 is formed by a combination of oxidation and silicon nitride deposition steps. These steps are carried out to fabricate an oxide-nitride-oxide (ONO) inter-gate dielectric layer. The polycrystalline silicon material used to form both floating gate electrode 64 and control gate electrode 68 is doped with a conductivity determining dopant. The doping process is performed either during the deposition cycle, or immediately following deposition of the polycrystalline silicon. In the case of an N-type MOS (NMOS) device, gate electrodes 64 and 68 are doped with an N-type dopant, such as phosphorus, arsenic, antimony, and the like. After defining stacked-gate electrode 61, source and drain regions 72 and 70, respectively, are formed in substrate 12 by ion implantation using stack gate electrode 61 as a doping mask.

As employed in the embodiment of the invention illustrated in FIG. 8, dielectric layer 14 functions as a tunnel gate dielectric material in an EEPROM device. The nitrogen accumulation characteristics of dielectric layer 14 provide a region of high nitrogen concentration at the interface between floating gate electrode 64 and dielectric layer 14. Additionally, a region of high nitrogen concentration may occur at the interface between dielectric layer 14 and substrate 12 as described above. The presence of regions of high nitrogen concentration at the interfaces functions to enhance the durability of layer 14 as a tunnel dielectric material during successive program and erase cycles commonly used to store information in EEPROM devices. The nitrogen rich regions of dielectric layer 14 reduce the formation of electron traps during Fowler-Nordheim tunneling at the programming and erasing stages. Thus, the presence of dielectric layer 14, formed in accordance with the invention, substantially increases the useful lifetime of a FETMOS EEPROM device.

Figure 9:
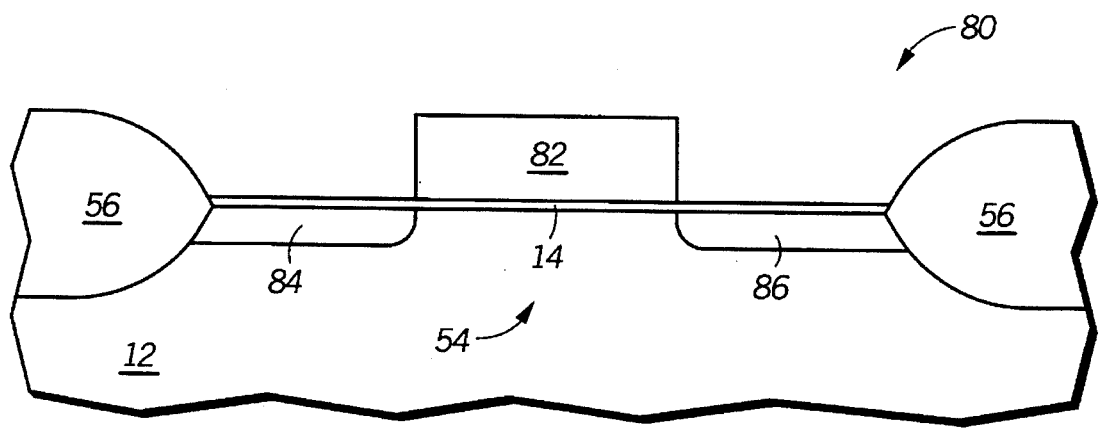
FIG. 9 illustrates, in cross-section, an MOS semiconductor device having a dielectric layer formed in accordance with the present invention.

Although the foregoing illustrative embodiment describes the use of dielectric layer 14 as a tunneling dielectric material, the advantages obtained by the use of dielectric layer 14 can be applied to other devices. For example, dielectric layer 14 can be used as a gate dielectric within an otherwise conventional MOS transistor. As illustrated in FIG. 9, a semiconductor device 80 is formed by forming dielectric layer 14 over active region 54 within substrate 12. Dielectric layer 14 is formed having a high nitrogen concentration at least a top interface of the dielectric, and if desired also at a bottom interface, as previously described in reference to FIGS. 1-4. A gate electrode 82 is deposited and patterned over dielectric layer 14. As a polysilicon layer, gate electrode 82 may initially serve as the buffer layer used to diffuse nitrogen into dielectric layer 14. The thickness of gate electrode 82 as compared to the buffer layer thickness used may be handled as described above in reference to using the invention in an EEPROM fabrication process. A source region 84 and a drain region 86 are formed within active region 54 aligned to sides of gate electrode 82 in accordance with a conventional MOS process. By incorporating dielectric layer 14 as a gate dielectric within a MOS transistor, durability of the dielectric material and transistor lifetime are improved.

The foregoing description demonstrates many of the advantages of practicing the present invention. A dielectric material formed in accordance with the present invention improves the charge-to-breakdown ($Q_{bd}$) value of a gate dielectric. A nitrogen pile-up at both a top and bottom interface of a gate dielectric is possible, thereby improving $Q_{bd}$ when electrons are injected from the gate and when electrons are injected from the substrate. In addition, the nitrogen pile-up at the top of the dielectric layer serves to block impurity species such as boron, fluorine, and phosphorus from penetrating the gate dielectric. Boron is sometimes incorporated into the gate dielectric and into the substrate upon implanting gate polysilicon with boron or $BF_2$, resulting in a threshold voltage shift. Fluorine sometimes diffuses through the gate dielectric during a tungsten polycide process, resulting in an unwanted increase in the gate dielectric thickness. High nitrogen concentrations at the top interface of the dielectric layer slows diffusion of these impurities through the dielectric, thereby lessening their adverse effects.

Thus it is apparent that there has been provided, in accordance with the invention, a process to incorporate nitrogen at an interface of a dielectric layer in a semiconductor device. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, nitrogen may be incorporated into the top interface of a dielectric layer without depositing a nitrogen source on the buffer layer, for example, by exposing the buffer layer to a gaseous nitrogen source (such as $NH_3$) or a nitrogen-containing plasma (such as $N_2$ or $NH_3$). Nitrogen from the gaseous or plasma source may then diffuse through the buffer layer and into the dielectric layer, resulting in a similar nitrogen concentration peak near the top of the dielectric. Furthermore, diffusion may be accomplished using heating methods other than conventional furnace heating or rapid thermal processing. For instance, nitrogen may be diffused using laser or e-beam technology. Moreover, the present invention is not limited to those nitrogen source layers previously listed. Other nitrogen source layer suitable for practicing the present invention include silicon nitride, boron nitride, aluminum nitride, and the like. In general, any material having sufficient free nitrogen to establish nitrogen diffusion through a buffer layer is suitable for use in the present invention. Therefore, it is intended that this invention encompass all such variations and modifications as fall within the scope of the appended claims.

We claim:

1. A process for fabricating a semiconductor device (10) comprising the steps of:

providing a substrate (12);

forming a first dielectric layer (14) on the substrate;

depositing a buffer layer (16) on the first dielectric layer;

depositing an oxynitride layer on the buffer layer; and annealing the device to diffuse nitrogen from the oxynitride layer through the buffer layer and into the first dielectric layer to create a region of high nitrogen concentration near an interface (15) between the buffer layer and the first dielectric layer.

2. The process of claim 1 wherein the step of annealing comprises annealing the device using rapid thermal processing for a time period within a range of about 10–300 seconds.

3. The process of claim 1 wherein the step of depositing a buffer layer comprises depositing polysilicon.

4. The process of claim 1 wherein the step of depositing a buffer layer comprises depositing amorphous silicon.

5. The process of the claim 1 wherein the step of forming a first dielectric layer comprises forming a dielectric selected from a group consisting of silicon dioxide and oxynitride.

6. A process for fabricating a semiconductor device comprising the steps of:

providing a substrate;

forming a first dielectric layer on the substrate;

depositing a buffer layer on the first dielectric layer;

forming a nitrogen source layer on the buffer layer; and annealing the device to diffuse nitrogen from the source layer through the buffer layer to accumulate nitrogen at an interface between the buffer layer and the first dielectric layer.

7. The process of claim 6 wherein the step of depositing a buffer layer comprises depositing a polysilicon layer.

8. The process of claim 6 wherein the step of depositing a buffer layer comprises depositing amorphous silicon.

9. The process of claim 6 wherein the step of depositing a nitrogen source layer comprises depositing an oxynitride layer.

10. The process of the claim 6 wherein the step of forming a first dielectric layer comprises forming a dielectric selected from a group consisting of silicon dioxide and oxynitride.

11. The process of claim 6 further comprising the steps of:

removing the nitrogen source layer and the buffer layer; and forming a gate electrode (61 or 82) overlying the first dielectric layer.

12. A process for fabricating a semiconductor device comprising the steps of:

providing a silicon substrate;

forming a first dielectric layer on the substrate;

depositing a silicon layer on the first dielectric layer;

forming a second dielectric layer on the silicon layer, wherein the second dielectric layer comprises nitrogen; and diffusing nitrogen from the second dielectric layer through the silicon layer to an interface between the silicon layer and the first dielectric layer.

13. The process of the claim 12 wherein the step of forming a first dielectric layer comprises forming a dielectric selected from a group consisting of silicon dioxide and oxynitride.

14. The process of claim 13 further comprising the steps of:

removing the nitrogen source layer; and forming a gate electrode (61 or 82) overlying the first dielectric layer using the silicon layer.

15. The process of claim 14 wherein the step of depositing silicon comprises depositing a first layer of polysilicon, and wherein the step of forming a gate electrode comprises:

after removing the nitrogen source layer, depositing a second polysilicon layer on the first polysilicon layer; and patterning the first and second polysilicon layers to form the gate electrode.

16. The process of claim 12 wherein the step of depositing a silicon layer comprises depositing a polysilicon layer having a thickness of between approximately 100–5000 angstroms.

17. The process of claim 12 wherein the step of depositing a buffer layer comprises depositing amorphous silicon.

18. The process of claim 12 wherein the step of forming a second dielectric layer comprises growing an oxynitride layer.

19. The process of claim 6 further comprising the steps of:

removing the nitrogen source layer; and forming a gate electrode (61 or 82) from the buffer layer.

* * * * *